(12) United States Patent
Hocker et al.

(10) Patent No.: US 10,098,253 B1
(45) Date of Patent: Oct. 9, 2018

(54) APPARATUS, SYSTEM, AND METHOD FOR ALIGNING AND SUPPORTING LINE CARDS WITHIN TELECOMMUNICATIONS SYSTEMS

(71) Applicant: Juniper Networks, Inc., Sunnyvale, CA (US)

(72) Inventors: Keith Hocker, Cupertino, CA (US); Franklin D. Boyden, Pleasanton, CA (US); Seongchul C. Kim, Saratoga, CA (US); Gilbert W. VanHoy, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 70 days.

(21) Appl. No.: 15/189,988

(22) Filed: Jun. 22, 2016

(51) Int. Cl.
*H05K 7/02* (2006.01)
*H05K 7/18* (2006.01)
*H05K 7/14* (2006.01)

(52) U.S. Cl.
CPC ........... *H05K 7/186* (2013.01); *H05K 7/1427* (2013.01); *H05K 7/1461* (2013.01)

(58) Field of Classification Search
CPC .................. H05K 7/1461; H05K 7/186
See application file for complete search history.

(56) References Cited

U.S. PATENT DOCUMENTS

| | | | | |
|---|---|---|---|---|
| 5,733,137 A | * | 3/1998 | Knoop | H05K 7/1407 29/432.2 |
| 6,039,590 A | * | 3/2000 | Kunishi | H01R 13/6315 439/247 |
| 2005/0239300 A1 | * | 10/2005 | Yasumura | H01R 13/6587 439/65 |

* cited by examiner

*Primary Examiner* — James Wu
*Assistant Examiner* — Hung Dang
(74) *Attorney, Agent, or Firm* — FisherBroyles, LLP

(57) ABSTRACT

The disclosed apparatus may include (1) at least one receptacle that (A) is coupled to a line card that facilitates communication among computing devices and (B) mates with at least one member coupled to a backplane of a telecommunications system to physically support the line card upon installation in the telecommunications system and (2) at least one spring that (A) is coupled to the receptacle and (B) applies, when the member is inserted into the receptacle, a force on the member to lift the line card in an upward direction. Various other apparatuses, systems, and methods are also disclosed.

16 Claims, 6 Drawing Sheets

US 10,098,253 B1

APPARATUS, SYSTEM, AND METHOD FOR ALIGNING AND SUPPORTING LINE CARDS WITHIN TELECOMMUNICATIONS SYSTEMS

BACKGROUND

Line cards are often installed in telecommunications systems (such as routers) to facilitate communication among computing devices within a network. In this context, the term "line card" typically refers to any type or form of Field-Replaceable Unit (FRU) with one or more ports and/or interfaces that forward traffic within a network and/or across multiple networks. For example, a router may include various Physical Interface Cards (PICS) and/or Flexible PIC Concentrators (FPCs) that facilitate communication among computing devices within a network and/or across multiple networks.

Due to their increasing sizes, functionalities, and/or complexities, these line cards may be relatively heavy and/or cumbersome. For example, an FPC may interface with the backplane of a router. This interface may be supported at least in part by two receptacles on the FPC that mate with two corresponding guide pins on the backplane. Unfortunately, the weight and/or orientation of this FPC may place a heavy load on the receptacles and/or guide pins. As a result, these receptacles and/or guide pins may end up bending, becoming distorted, and/or breaking as the FPC is inserted into the router, maintained in the router, and/or removed from the router.

The instant disclosure, therefore, identifies and addresses a need for improved and/or additional apparatuses, systems, and methods for aligning and supporting line cards within telecommunications systems.

SUMMARY

As will be described in greater detail below, the instant disclosure generally relates to apparatuses, systems, and methods for aligning and supporting line cards within telecommunications systems. In one example, an apparatus for accomplishing such a task may include (1) at least one receptacle that (A) is coupled to a line card that facilitates communication among computing devices and (B) mates with at least one member coupled to a backplane of a telecommunications system to physically support the line card upon installation in the telecommunications system and (2) at least one spring that (A) is coupled to the receptacle and (B) applies, when the member is inserted into the receptacle, a force on the member to lift the line card in an upward direction.

Similarly, a system that incorporates the above-described apparatus may include (1) a line card that facilitates communication among computing devices, (2) at least one receptacle that (A) is coupled to the line card and (B) mates with at least one member coupled to a backplane of a telecommunications system to physically support the line card upon installation in the telecommunications system, and (3) at least one spring that (A) is coupled to the receptacle and (B) applies, when the member is inserted into the receptacle, a force on the member to lift the line card in an upward direction relative to a horizontal cross section of the telecommunications system.

A corresponding method may include (1) securing at least one spring to a receptacle that mates with at least one member coupled to a backplane of a telecommunications system and (2) coupling the receptacle to a line card that facilitates communication among computing devices within a network such that, when the member coupled to the backplane is inserted into the receptacle, the spring secured to the receptacle applies a force on the member coupled to the backplane to lift the line card in an upward direction relative to a horizontal cross section of the telecommunications system.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
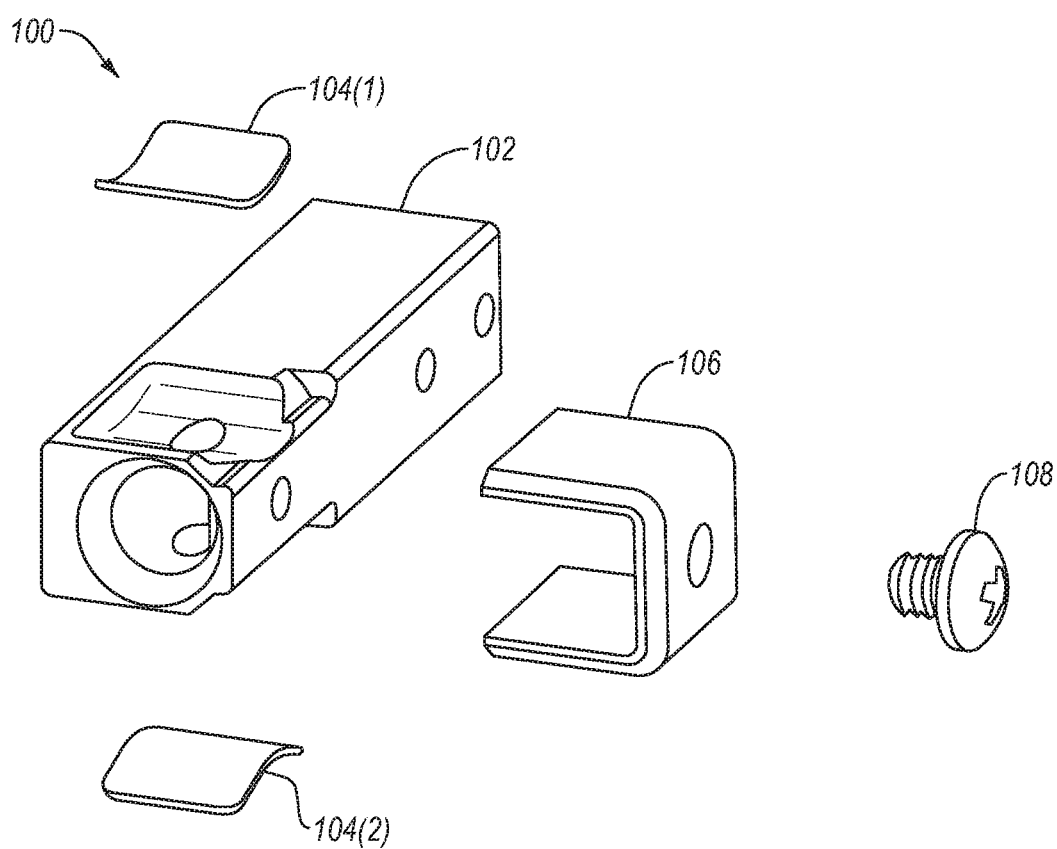
FIG. 1 is a block diagram of an exemplary apparatus for aligning and supporting line cards within telecommunications systems.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for aligning and supporting line cards within telecommunications systems. As will be explained in greater detail below, embodiments of the instant disclosure may help align, center, and/or straighten line cards within telecommunications systems. For example, a heavy line card may place a large burden and/or load on the connectors (such as receptacles and/or members) that secure the line card to a telecommunications system. However, embodiments of the instant disclosure may relieve and/or reduce the burden and/or load placed on those connectors. As a result, these embodiments may prevent the connectors from bending, distorting, and/or breaking as the line card is inserted into the telecommunications system, maintained in the telecommunications system, and/or removed from the telecommunications system.

As a specific example, a set of receptacles may be coupled to a line card. In this example, the receptacles may facilitate installing the line card in a telecommunications system by mating with a set of members coupled to the backplane of the telecommunications system. These receptacles may each include springs that relieve and/or reduce the burden and/or load of the line card by compensating and/or accounting for different tolerances of and/or variances in the multitude of parts and/or components incorporated in the telecommunications system. For example, the springs included in each receptacle may make physical contact with a corresponding member coupled to the backplane of the telecommunications system. These springs may deflect the member and/or apply a downward force on the member, thereby lifting the line card away from the member and/or the ground surface. As a result, the line card may effectively align, center, and/or straighten itself relative to the telecommunications system.

The following will provide, with reference to FIGS. 1-5, examples of apparatuses and corresponding implementations for aligning and supporting line cards within telecommunications systems. In addition, detailed descriptions of exemplary methods for aligning and supporting line cards within telecommunications systems will be provided in connection with FIG. 6.

FIG. 1 shows an exploded view of an exemplary apparatus 100 for aligning and supporting line cards within telecommunications systems. As illustrated in FIG. 1, apparatus 100 may include a receptacle 102 designed to mate with a member coupled to a backplane of a telecommunications system. In this example, receptacle 102 may be coupled to a line card (not illustrated in FIG. 1) that facilitates communication among computing devices within a network as part of the telecommunications system. When the member coupled to the backplane is inserted into receptacle 102, this combination of receptacle 102 and the member may physically support the line card within the telecommunications system.

Receptacle 102 generally represents any type or form of housing, slot, and/or enclosure that serves as part of a connector mechanism. The term "connector," as used herein, generally refers to any type or form of full or partial fastener, fitting, and/or coupling that facilitates a physical and/or mechanical connection and/or interface between a line card and the backplane of a telecommunications system.

As illustrated in FIG. 1, apparatus 100 may also include springs 104(1) and 104(2) designed to apply a force on a member coupled to the backplane of the telecommunications system when the member is inserted into receptacle 102. In this example, springs 104(1) and 104(2) may be secured and/or coupled to receptacle 102 by a bracket 106. For example, bracket 106 may be secured and/or coupled to receptacle 102 by a screw 108. As a result, bracket 106 may effectively hold and/or fix springs 104(1) and 104(2) in place against receptacle 102.

During installation of the line card in the telecommunications system, the member coupled to the backplane may be inserted into receptacle 102. When the member coupled to the backplane is inserted into receptacle 102, springs 104(1) and 104(2) may impart and/or exert a spring and/or mechanical force on the member coupled to the backplane. This force may effectively relieve and/or reduce the burden and/or load of the line card from the perspective of receptacle 102 and/or the member coupled to the backplane. Additionally or alternatively, this force may deflect the line card away from the member and/or the ground in an upward direction, thereby aligning, centering, and/or straightening the line card relative to the telecommunications system. Accordingly, springs 104(1) and 104(2) may be able to effectively reduce the weight of line card and/or the amount of force applied by the line card on receptacle 102 and/or the member coupled to the backplane due to gravity.

In one example, springs 104(1) and 104(2) may each include and/or represent a leaf spring. Additional examples of springs 104(1) and 104(2) include, without limitation, tension springs, extension springs, horseshoe springs, torsion springs, compression springs, coil springs, constant-force springs, gas springs, combinations or variations of one or more of the same, and/or any other suitable springs.

In one example, bracket 106 may include and/or represent a U-bracket or horseshoe bracket and/or U-lock or horseshoe lock. Alternatively, bracket 106 may include and/or represent any other type of bracket capable of holding springs 104(1) and 104(2) in place against receptacle 102. Similarly, screw 108 may include and/or represent any type or form of screw and/or fastener capable of securing and/or coupling bracket 106 to receptacle 102.

Figure 2:
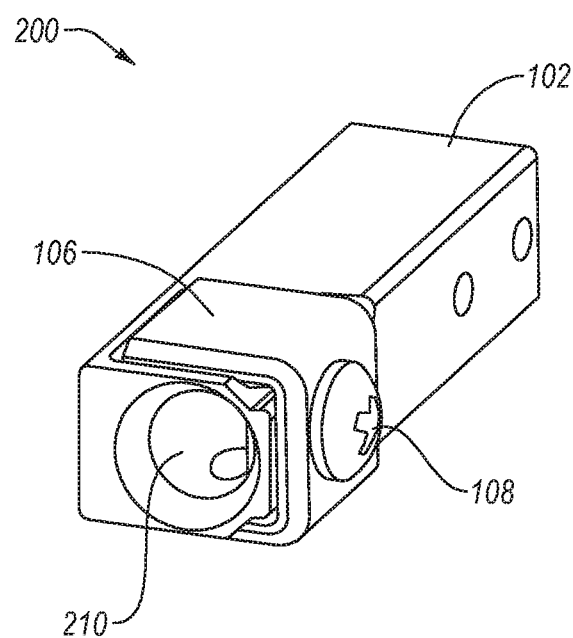
FIG. 2 is a block diagram of an exemplary apparatus for aligning and supporting line cards within telecommunications systems.

FIG. 2 shows an assembled view of an exemplary apparatus 200 for aligning and supporting line cards within telecommunications systems. As illustrated in FIG. 2, apparatus 200 may include screw 108, which secures and/or couples bracket 106 to receptacle 102. In this example, bracket 106 may secure and/or hold springs 104(1) and 104(2) (not necessarily illustrated in FIG. 2) in place against receptacle 102. Additionally or alternatively, receptacle 102 may include a borehole 210 that is designed to house and/or interface with a member coupled to the backplane of a telecommunications system.

Figure 3:
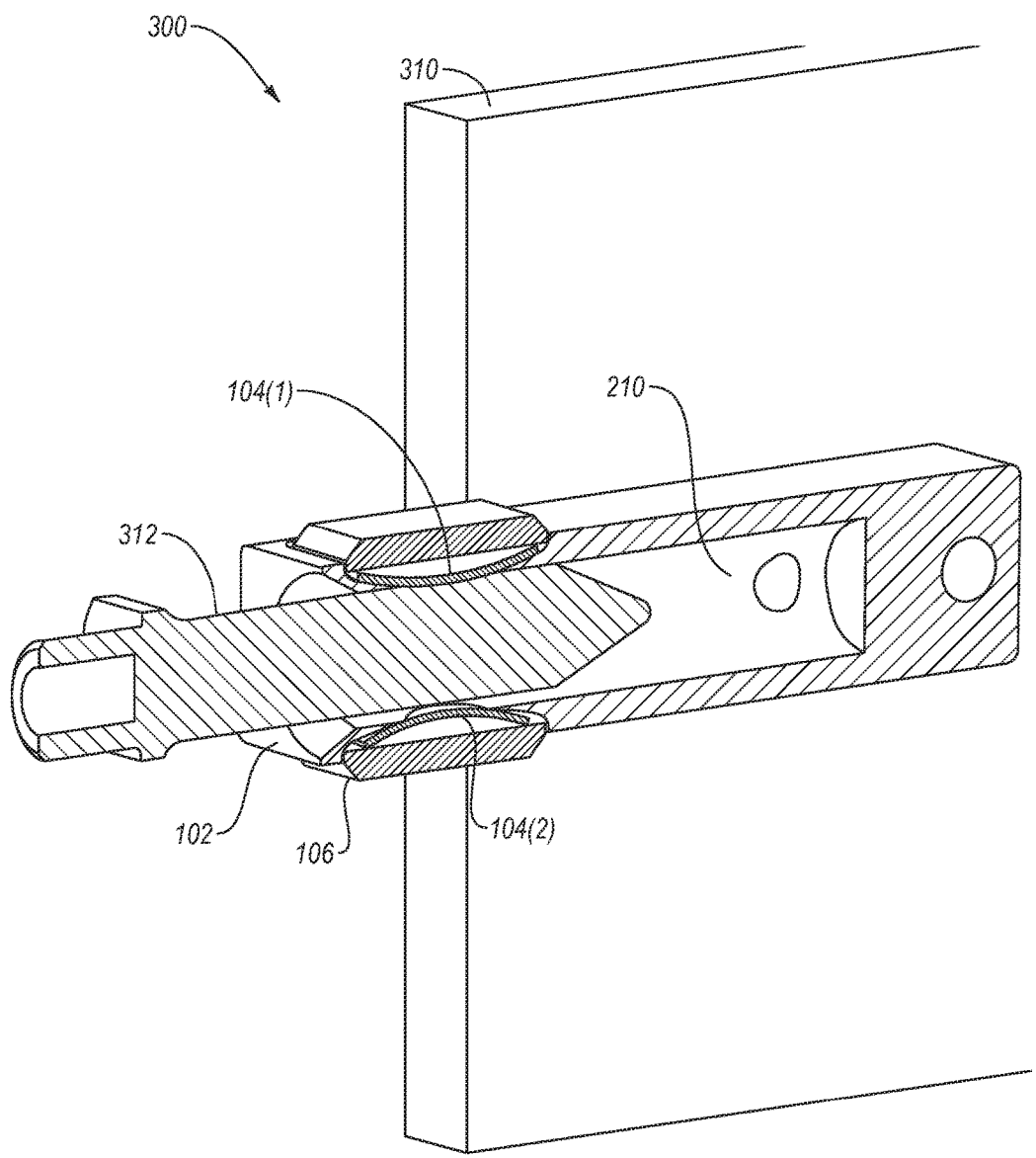
FIG. 3 is a block diagram of an exemplary implementation of an apparatus for aligning and supporting line cards within telecommunications systems.

FIG. 3 shows an exemplary implementation of an apparatus for aligning and supporting line cards within telecommunications systems from a vertical cross-section view. As illustrated in FIG. 3, implementation 300 may include and/or involve receptacle 102 secured and/or coupled to a line card 310. In this example, implementation 300 may also include and/or involve a member 312 that is secured and/or coupled to the backplane of a telecommunications system (not necessarily illustrated in FIG. 3). During installation of line card 310 into the telecommunications system, member 312 may be inserted into borehole 210 of receptacle 102 to facilitate mating and/or connecting line card 310 with the backplane of the telecommunications system.

Member 312 generally represents any type or form of physical object and/or shaft that is coupled to a telecommunications system and/or physically interfaces with a receptacle to facilitate aligning and/or supporting a line card within the telecommunications system. In one example, member 312 may include and/or represent a guide pin. Additional examples of member 312 include, without limitation, handles, levers, shafts, arms, knobs, cams, portions of one or more of the same, combinations or variations of one or more of the same, and/or any other suitable member.

Line card 310 generally represents any type or form of circuit board and/or FRU that facilitates forwarding traffic within a network and/or across multiple networks. In one example, line card 310 may include and/or represent an FPC. Additional examples of line card 310 include, without limitation, PICs, Switch Interface Boards (SIBS), control boards, routing engines, communication ports, fan trays, connector interface panels, combinations or variations of one or more of the same, and/or any other suitable line card.

As illustrated in FIG. 3, springs 104(1) and 104(2) may be arranged and/or positioned vertically relative to one another.

For example, spring 104(1) may be positioned on and/or secured to the top side of receptacle 102. In this example, spring 104(2) may be positioned on and/or secured to the bottom side of receptacle 102. Alternatively, springs 104(1) and 104(2) may be arranged and/or positioned horizontally relative to one another.

In one example, springs 104(1) and 104(2) may make contact with and/or press against member 312. In doing so, springs 104(1) and 104(2) may deflect member 312. For example, spring 104(1) may press downward onto member 312 and/or apply a downward force on member 312. In contrast, spring 104(2) may press upward onto member 312 and/or apply an upward force on member 312. Springs 104(1) and 104(2) may be tuned to provide the correct amounts of force to ultimately lift line card 310 in an upward direction. As a result, line card 310 may effectively align, center, and/or straighten itself relative to the telecommunications system. Additionally or alternatively, springs 104(1) and 104(2) may prevent receptacle 102 and/or member 312 from bending, distorting, and/or breaking as line card 310 is inserted into the telecommunications system, maintained in the telecommunications system, and/or removed from the telecommunications system.

Figure 4:
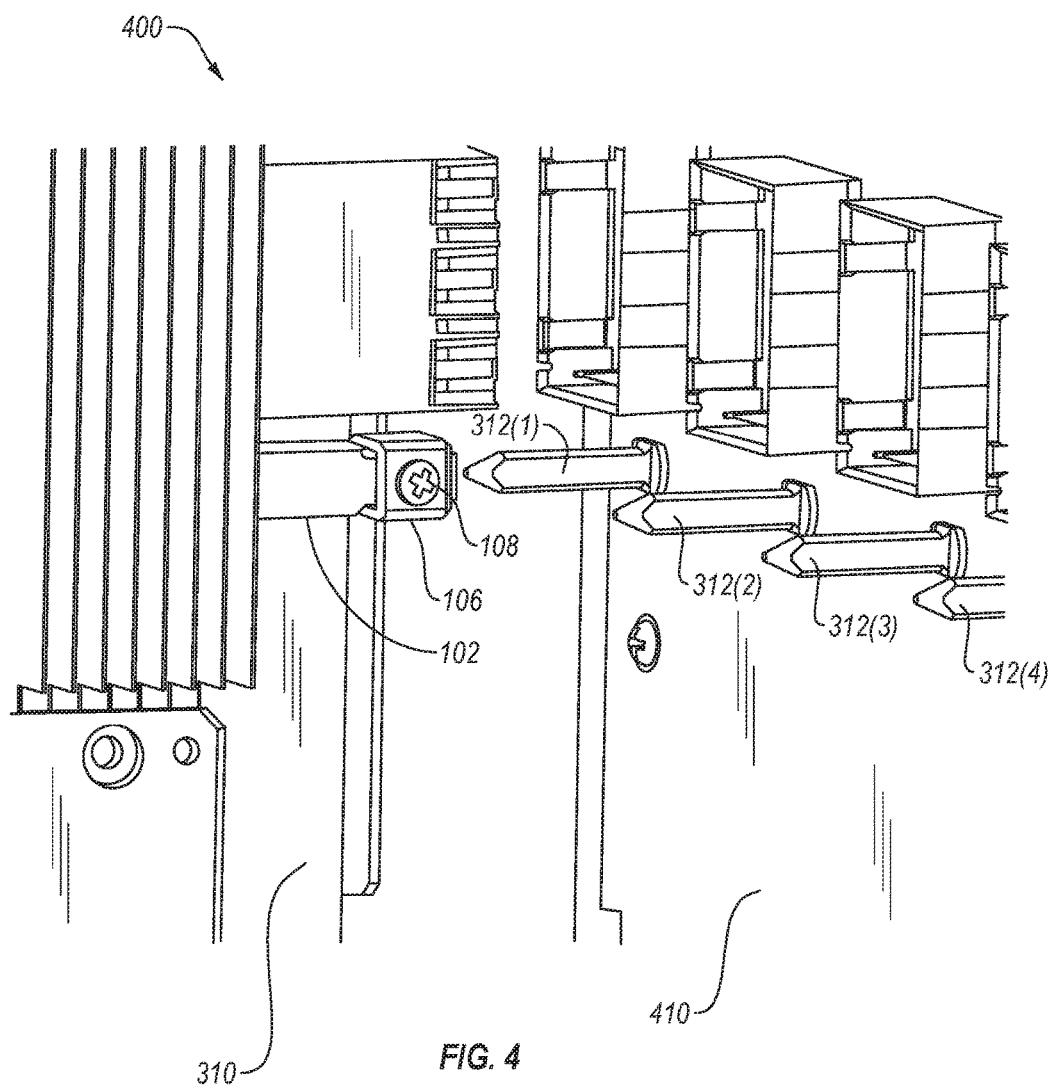
FIG. 4 is a block diagram of an exemplary implementation of an apparatus for aligning and supporting line cards within telecommunications systems.

FIG. 4 shows an exemplary implementation of an apparatus for aligning and supporting line cards within telecommunications systems. As illustrated in FIG. 4, implementation 400 may include and/or involve a line card 310 being installed into and/or removed from a telecommunications system 410. In this example, telecommunications system 410 may include a set of members 312(1), 312(2), 312(3), and 312(4). Telecommunications system 410 may also include one or more other members that are not illustrated in FIG. 4. Additionally or alternatively, line card 310 may include one or more other receptacles that are not illustrated in FIG. 4.

Telecommunications system 410 generally represents any type or form of computing device that routes and/or forwards traffic within a network and/or across multiple networks. In one example, telecommunications system 410 may include and/or represent a router (such as a provider edge router, a hub router, a spoke router, an autonomous system boundary router, and/or an area border router). Additionally or alternatively, telecommunications system 410 may include and/or represent a backplane of a router. Additional examples of telecommunications system 410 include, without limitation, switches, hubs, modems, bridges, repeaters, gateways, multiplexers, network adapters, network interfaces, network racks, chasses, servers, portions of one or more of the same, combinations or variations of one or more of the same, and/or any other suitable telecommunications system.

In one example, each of members 312(1)-(4) may be positioned in and/or correspond to a different vertical slot and/or housing designed for a line card within telecommunications system 410. In this example, each of the line cards (including, e.g., line card 310) installed into these slots and/or housings within telecommunications system 410 may be positioned in a vertical orientation relative to the horizontal cross section of telecommunications system 410.

Figure 5:
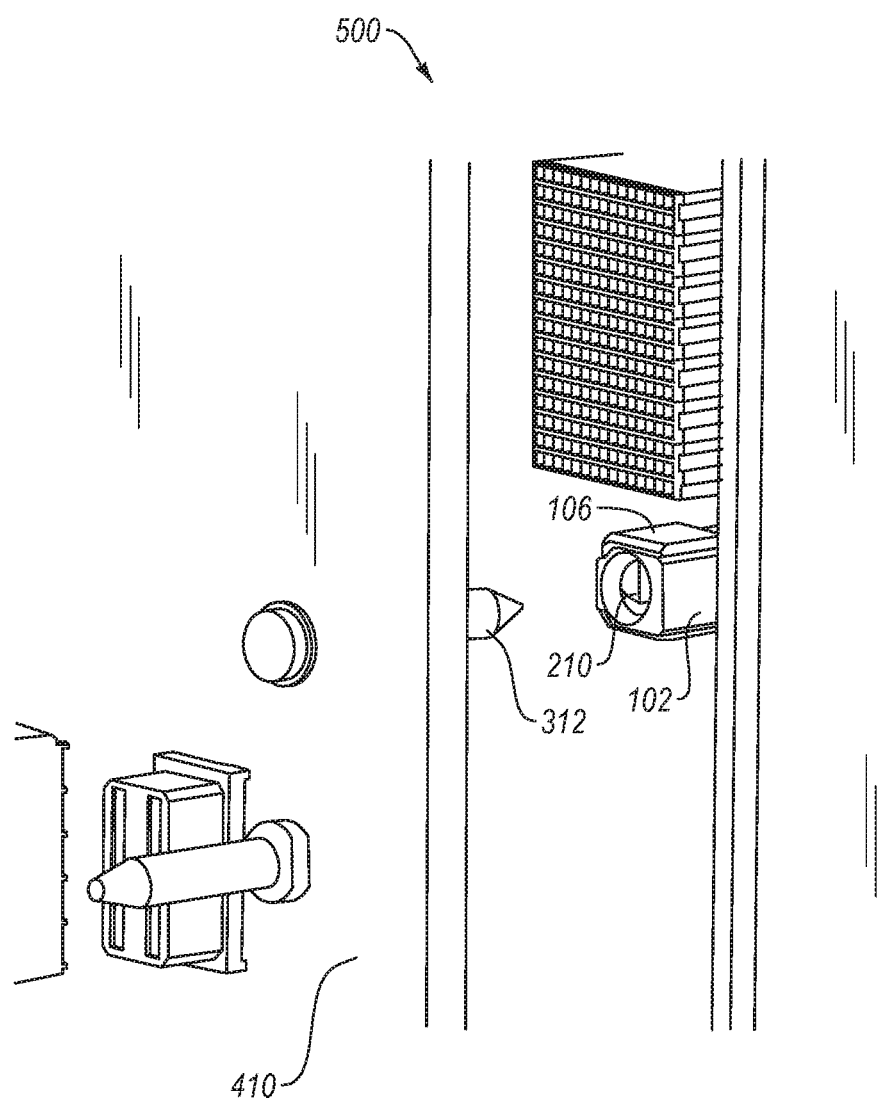
FIG. 5 is a block diagram of an exemplary implementation of an apparatus for aligning and supporting line cards within telecommunications systems.

Alternatively, although not illustrated in this way in FIGS. 4 and 5, each of members 312(1)-(4) may be positioned in and/or correspond to a different horizontal slot and/or housing designed for a line card within telecommunications system 410. In this example, each of the line cards (including, e.g., line card 310) installed into these slots and/or housings within telecommunications system 410 may be positioned in a horizontal orientation relative to the horizontal cross section of telecommunications system 410.

In one example, each of the line cards (including, e.g., line card 310) installed into these slots and/or housings within telecommunications system 410 may include multiple receptacles. Each of these receptacles on a single line card may mate with a corresponding member coupled to the backplane of telecommunications system 410 to physically support that line card during installation, operation, and/or removal. For example, line card 310 may include two receptacles (not necessarily illustrated in FIGS. 3-5) that are arranged substantially vertically relative to one another. In this example, these two receptacles may mate with two corresponding members (not necessarily illustrated in FIGS. 4 and 5) that are coupled to the backplane of telecommunications system 410 in a vertical orientation.

Alternatively, although not illustrated in this way in FIGS. 4 and 5, line card 310 may include two receptacles (not necessarily illustrated in FIGS. 3-5) that are arranged substantially horizontally relative to one another. In this example, these two receptacles may mate with two corresponding members (not necessarily illustrated in FIGS. 4 and 5) that are coupled to the backplane of telecommunications system 410 in a horizontal orientation.

FIG. 5 shows an exemplary implementation of an apparatus for aligning and supporting line cards within telecommunications systems. As illustrated in FIG. 5, implementation 500 may include and/or involve a line card 310 being installed into and/or removed from a telecommunications system 410. In this example, telecommunications system 410 may include member 312 being inserted into receptacle 102 during installation of line card 310 or being removed from receptacle 102 during removal of line card 310. Telecommunications system 410 may also include one or more other members that are not illustrated in FIG. 5. Additionally or alternatively, line card 310 may include one or more other receptacles that are not illustrated in FIG. 5.

Figure 6:
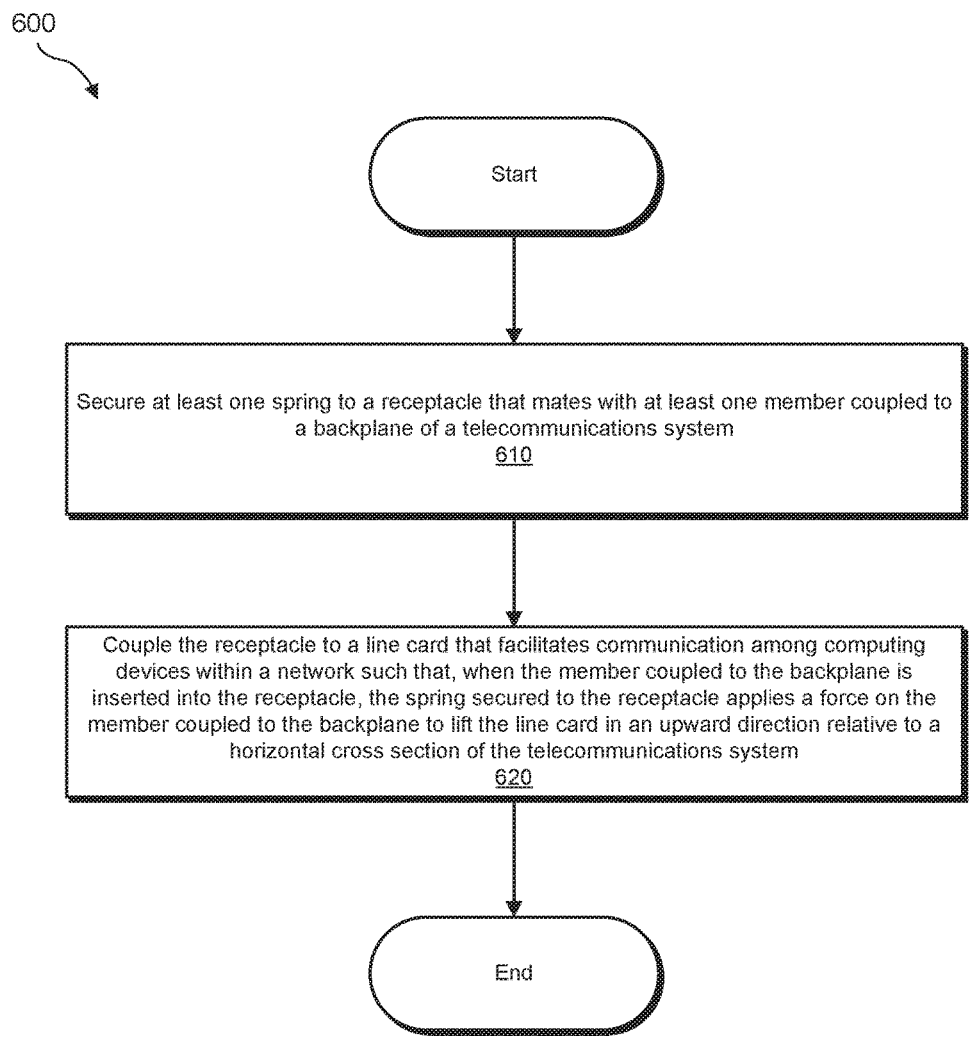
FIG. 6 is a flow diagram of an exemplary method for aligning and supporting line cards within telecommunications systems.

FIG. 6 is a flow diagram of an exemplary method 600 for aligning and supporting line cards within telecommunications systems. As illustrated in FIG. 6, method 600 may include the step of securing at least one spring to a receptacle that mates with at least one member coupled to a backplane of a telecommunications system (610). This securing step may be performed in a variety of ways and/or contexts. For example, a telecommunications equipment manufacturer and/or subcontractor may manufacture line card 310. During this manufacturing process, the telecommunications equipment manufacturer and/or subcontractor may manually secure, couple, and/or fix springs 104(1) and 104(2) to receptacle 102 by way of bracket 106 and/or screw 108.

Additionally or alternatively, the telecommunications equipment manufacturer may utilize computer-controlled and/or automated robotics to couple springs 104(1) and 104(2) to receptacle 102. For example, the telecommunications equipment manufacturer may implement a robotic assembly system that includes certain combinations of hardware, software, and/or firmware. In this example, the robotic assembly system may control a hardware-based robotic tool that physically secures, couples, and/or fixes springs 104(1) and 104(2) to receptacle 102 as directed and/or programmed by certain software and/or firmware modules.

Returning to FIG. 6, method 600 may also include the step of coupling the receptacle to a line card that facilitates communication among computing devices within a network such that, when the member coupled to the backplane is inserted into the receptacle, the spring secured to the receptacle applies a force on the member coupled to the backplane to lift the line card in an upward direction relative to a horizontal cross section of the telecommunications system (620). This coupling step may be performed in a variety of ways and/or contexts. For example, a telecommunications equipment manufacturer and/or subcontractor may manually secure, couple, and/or fix receptacle 102 to line card 310, which is designed to facilitate communication among computing devices as part of a telecommunications system. In this example, the telecommunications equipment manufacturer and/or subcontractor may also manually secure, couple, and/or fix one or more other receptacles to line card 310. Additionally or alternatively, the telecommunication equipment manufacturer may implement a robotic assembly system that controls a hardware-based robotic tool that secures, couples, and/or fixes receptacle 102 to line card 310.

As explained above in connection with FIGS. 1-6, spring-loaded guide receptacles may be able to align, center, and/or straighten line cards within telecommunications systems. For example, a heavy line card may place a large burden and/or load on the connectors (such as receptacles and/or members) that secure the line card to a telecommunications system. However, by incorporating spring-loaded mechanisms within the receptacles on the line card, these spring-loaded mechanisms may be able to relieve and/or reduce the burden and/or load placed on the connectors. As a result, the connectors may be less likely to bend, distort, and/or break as the line card is inserted into the telecommunications system, maintained in the telecommunications system, and/or removed from the telecommunications system.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
   at least one receptacle that:
      is coupled to a line card that facilitates communication among computing devices; and
      mates with at least one member coupled to a backplane of a telecommunications device to physically support the line card upon installation in the telecommunications device; and
   a plurality of leaf springs that:
      are secured to the receptacle by a U-bracket;
      reside between the receptacle and the U-bracket;
      are arranged vertically relative to one another such that one of the leaf springs is secured to a top side of the receptacle relative to a horizontal cross section of the telecommunications device and another one of the leaf springs is secured to a bottom side of the receptacle relative to the horizontal cross section of the telecommunications device; and
      when the member coupled to the backplane is inserted into the receptacle, apply a force on the member coupled to the backplane to lift the line card in an upward direction.

2. The apparatus of claim 1, wherein the plurality of leaf springs impart the force on the member to deflect the line card away from the member in the upward direction.

3. The apparatus of claim 1, wherein the plurality of leaf springs reduce the amount of force applied by the line card on the receptacle or the member due to gravity.

4. The apparatus of claim 1, wherein:
   when the member is inserted into the receptacle, the line card mates with the backplane of the telecommunications device; and
   the line card is positioned in a vertical orientation relative to the horizontal cross section of the telecommunications device.

5. The apparatus of claim 1, wherein the line card comprises at least one of:
   a Physical Interface Card (PIC); and
   a Flexible PIC Concentrator (FPC).

6. The apparatus of claim 1, wherein the receptacle comprises a plurality of receptacles that:
   are coupled to the line card; and
   mate with a plurality of members coupled to the backplane of the telecommunications device to physically support the line card upon installation in the telecommunications device.

7. The apparatus of claim 1, wherein:
   the leaf spring secured to the top side of the receptacle presses downward onto the member coupled to the backplane of the telecommunications device; and
   the leaf spring secured to the bottom side of the receptacle presses upward onto the member coupled to the backplane of the telecommunications device.

8. The apparatus of claim 1, wherein the member coupled to the backplane of the telecommunications device comprises a guide pin.

9. A system comprising:
   a line card that facilitates communication among computing devices; and
   at least one receptacle that:
      is coupled to the line card; and mates with at least one member coupled to a backplane of a telecommunications device to physically support the line card upon installation in the telecommunications device; and a plurality of leaf springs that:
are secured to the receptacle by a U-bracket;
reside between the receptacle and the U-bracket;
are arranged vertically relative to one another such that one of the leaf springs is secured to a top side of the receptacle relative to a horizontal cross section of the telecommunications device and another one of the leaf springs is secured to a bottom side of the receptacle relative to the horizontal cross section of the telecommunications device; and
when the member coupled to the backplane is inserted into the receptacle, apply a force on the member coupled to the backplane to lift the line card in an upward direction relative to a horizontal cross section.

10. The system of claim 9, wherein the plurality of leaf springs impart the force on the member to deflect the line card away from the member in the upward direction away from a ground surface.

11. The system of claim 9, wherein the plurality of leaf springs reduce the amount of force applied by the line card on the receptacle or the member due to gravity.

12. The system of claim 9, wherein:
when the member is inserted into the receptacle, the line card mates with the backplane of the telecommunications device; and
the line card is positioned in a vertical orientation relative to the horizontal cross section of the telecommunications device.

13. The system of claim 9, wherein the line card comprises at least one of:
a Physical Interface Card (PIC); and
a Flexible PIC Concentrator (FPC).

14. The system of claim 9, wherein the receptacle comprises a plurality of receptacles that:
are coupled to the line card; and
mate with a plurality of members coupled to the backplane of the telecommunications device to physically support the line card upon installation in the telecommunications device.

15. The system of claim 9, wherein:
the leaf spring secured to the top side of the receptacle presses downward onto the member coupled to the backplane of the telecommunications device; and
the leaf spring secured to the bottom side of the receptacle presses upward onto the member coupled to the backplane of the telecommunications device.

16. A method comprising:
securing, by way of a U-bracket, a plurality of leaf springs to a receptacle that mates with at least one member coupled to a backplane of a telecommunications device, the plurality of leaf springs:
residing between the receptacle and the U-bracket; and
being arranged vertically relative to one another such that one of the leaf springs is secured to a top side of the receptacle relative to a horizontal cross section of the telecommunications device and another one of the leaf springs is secured to a bottom side of the receptacle relative to the horizontal cross section of the telecommunications device; and
coupling the receptacle to a line card that facilitates communication among computing devices within a network such that, when the member coupled to the backplane is inserted into the receptacle, the plurality of leaf springs secured to the receptacle apply a force on the member coupled to the backplane to lift the line card in an upward direction relative to a horizontal cross section of the telecommunications device.

* * * * *